US010293573B2

(12) United States Patent
Taniguchi

(10) Patent No.: US 10,293,573 B2
(45) Date of Patent: May 21, 2019

(54) MICRO FLOW CHANNEL CHIP AND METHOD FOR PRODUCING FLOW CHANNEL CHIP

(71) Applicant: SUMITOMO BAKELITE CO., LTD., Tokyo (JP)

(72) Inventor: Hirohito Taniguchi, Tokyo (JP)

(73) Assignee: SUMITOMO BAKELITE COMPANY LIMITED, Tokyo (JP)

( * ) Notice: Subject to any disclaimer, the term of this patent is extended or adjusted under 35 U.S.C. 154(b) by 0 days.

(21) Appl. No.: 15/389,820

(22) Filed: Dec. 23, 2016

(65) Prior Publication Data

US 2017/0203537 A1 Jul. 20, 2017

(30) Foreign Application Priority Data

Jan. 6, 2016 (JP) ................................ 2016-001077

(51) Int. Cl.
*B29C 59/00* (2006.01)
*B32B 3/30* (2006.01)
(Continued)

(52) U.S. Cl.
CPC .......... *B32B 3/30* (2013.01); *B01L 3/502707* (2013.01); *B01L 3/502715* (2013.01);
(Continued)

(58) Field of Classification Search
CPC .... B32B 3/30; B32B 3/26; B32B 3/00; B01L 3/502707; B01L 3/5027; B01L 3/502;
(Continued)

(56) References Cited

U.S. PATENT DOCUMENTS

2003/0175162 A1* 9/2003 Anazawa ............ B01J 19/0093 422/537
2011/0151198 A1* 6/2011 Washizu ............ B01J 19/0093 428/172

FOREIGN PATENT DOCUMENTS

JP 5948248 B2 * 7/2016 ............ G01N 35/08
WO 2012/060186 A1 5/2012

OTHER PUBLICATIONS

JP 5948248 English Machine Translation of Description and Claims, Microchip and Method for Manufacturing Microchip, obtained from https://www4.j-platpat.inpit.go.jp/eng/tokujitsu/tkbs_en/TKBS_EN_GM101_Top.action, on Feb. 13, 2018, pp. 1-24. (Year: 2018).*

* cited by examiner

*Primary Examiner* — Christine T Mui
(74) *Attorney, Agent, or Firm* — Westerman, Hattori, Daniels & Adrian, LLP

(57) ABSTRACT

Provided is a method for producing a micro flow channel chip that is used for a treatment or analysis of a liquid sample, the method being capable of producing a micro flow channel chip with high shape accuracy and high efficiency. The method includes a step of forming a groove on one surface of a base material; a lamination step of forming an adhesive resin layer on at least one surface of a resin film, and thereby obtaining a first laminate; and an adhesion step of arranging the surface of the base material where a groove has been formed and the adhesive resin layer of the first laminate to face each other, and bonding the base material and the first laminate such that the adhesive resin layer covers the groove, in which the glass transition temperature of the adhesive resin layer is 25° C. or lower.

12 Claims, 1 Drawing Sheet

(51) Int. Cl.

| | |
|---|---|
| ***B01L 3/00*** | (2006.01) |
| ***B29C 65/48*** | (2006.01) |
| ***B29C 65/00*** | (2006.01) |
| ***B32B 7/12*** | (2006.01) |
| ***B32B 27/08*** | (2006.01) |
| ***B32B 37/12*** | (2006.01) |
| ***F16K 99/00*** | (2006.01) |
| ***B32B 27/18*** | (2006.01) |
| ***B32B 27/20*** | (2006.01) |
| ***B32B 27/28*** | (2006.01) |
| ***B32B 27/30*** | (2006.01) |
| ***B32B 27/32*** | (2006.01) |
| ***B32B 27/34*** | (2006.01) |
| ***B32B 27/36*** | (2006.01) |
| ***B32B 37/00*** | (2006.01) |
| ***B32B 3/26*** | (2006.01) |
| ***B81C 1/00*** | (2006.01) |
| *B29L 31/00* | (2006.01) |

(52) U.S. Cl.

CPC ........ *B29C 59/007* (2013.01); *B29C 65/4825* (2013.01); *B29C 66/45* (2013.01); *B32B 3/266* (2013.01); *B32B 7/12* (2013.01); *B32B 27/08* (2013.01); *B32B 27/18* (2013.01); *B32B 27/20* (2013.01); *B32B 27/281* (2013.01); *B32B 27/283* (2013.01); *B32B 27/286* (2013.01); *B32B 27/302* (2013.01); *B32B 27/304* (2013.01); *B32B 27/306* (2013.01); *B32B 27/308* (2013.01); *B32B 27/32* (2013.01); *B32B 27/34* (2013.01); *B32B 27/36* (2013.01); *B32B 27/365* (2013.01); *B32B 37/0007* (2013.01); *B32B 37/0076* (2013.01); *B32B 37/12* (2013.01); *B81C 1/00119* (2013.01); *F16K 99/0001* (2013.01); *B01L 2200/12* (2013.01); *B01L 2300/0816* (2013.01); *B01L 2300/0877* (2013.01); *B01L 2300/0887* (2013.01); *B01L 2300/12* (2013.01); *B29C 65/483* (2013.01); *B29C 66/1122* (2013.01); *B29C 66/53461* (2013.01); *B29C 66/71* (2013.01); *B29C 66/919* (2013.01); *B29C 66/91941* (2013.01); *B29C 66/929* (2013.01); *B29L 2031/756* (2013.01); *B32B 37/003* (2013.01); *B32B 37/0015* (2013.01); *B32B 2250/02* (2013.01); *B32B 2250/24* (2013.01); *B32B 2255/10* (2013.01); *B32B 2255/26* (2013.01); *B32B 2307/3065* (2013.01); *B32B 2307/422* (2013.01); *B32B 2307/50* (2013.01); *B32B 2307/546* (2013.01); *B32B 2307/58* (2013.01); *B32B 2307/728* (2013.01); *B32B 2307/73* (2013.01); *B32B 2307/732* (2013.01); *B32B 2309/02* (2013.01); *B32B 2535/00* (2013.01); *B81B 2201/058* (2013.01); *B81C 2201/019* (2013.01); *F16K 2099/0084* (2013.01)

(58) Field of Classification Search

CPC .... B01L 3/50; B01L 3/502715; B29C 59/007; B29C 59/00

USPC .......................... 422/503, 502, 501, 500, 50

See application file for complete search history.

MICRO FLOW CHANNEL CHIP AND METHOD FOR PRODUCING FLOW CHANNEL CHIP

TECHNICAL FIELD OF THE INVENTION

The present invention relates to a micro flow channel chip and a method for producing a micro flow channel chip.

RELATED ART

In recent years, development of micro flow channel chips has been considered increasingly important.

Regarding the method for producing a micro flow channel chip, for example, as described in Patent Document 1, there is available a method for producing a micro flow channel chip by joining a substrate on which grooves for flow channels have been formed, with a cover member that covers the grooves.

PRIOR ART DOCUMENT

Patent Document

[Patent Document 1] PCT International Publication No. WO 2012/060186

DISCLOSURE OF THE INVENTION

Problems to be Solved by the Invention

However, in the method of Patent Document 1, when a substrate and a cover member are joined, since the substrate and the cover member are thermally fused, deflection occurs in the film of the cover member, and thus, it is difficult to cope with the requirement for further accuracy enhancement of the flow channel structure.

It is an object of the invention to provide a micro flow channel chip that is used for a treatment or analysis of a liquid sample and that can be produced with high shape accuracy and high efficiency, and a method for producing the micro flow channel chip.

Means for Solving the Problem

In order to solve the problems described above, the invention provides the following method for producing a micro flow channel chip.

(1) A method for producing a micro flow channel chip, the method including:

a step of forming a groove on one surface of a base material;

a lamination step of forming an adhesive resin layer on at least one surface of a resin film, and thereby obtaining a first laminate; and an adhesion step of arranging the surface of the base material having a groove formed thereon and the adhesive resin layer of the first laminate to face each other, and bonding the two such that the adhesive resin layer covers the groove, wherein the glass transition temperature of the adhesive resin layer is 25° C. or lower.

(2) A micro flow channel chip including:

a base material that has a groove formed on one surface;

a resin film; and an adhesive resin layer that covers the groove of the base material and that bonds the resin film to the surface of the base material, wherein the glass transition temperature of the adhesive resin layer is 25° C. or lower.

Effects of the Invention

According to the invention, a micro flow channel chip that is used for a treatment or analysis of a liquid sample and that can be produced with high shape accuracy and high efficiency, can be provided.

BRIEF DESCRIPTION OF THE DRAWINGS

FIG. 2A illustrates a base material having a groove formed on one surface, FIG. 2B illustrates a first laminate that includes a resin film and an adhesive resin layer, and FIG. 2C illustrates a cross-section of the micro flow channel chip cut along the line A-A in FIG. 1.

EMBODIMENTS OF THE INVENTION

Figure 1:
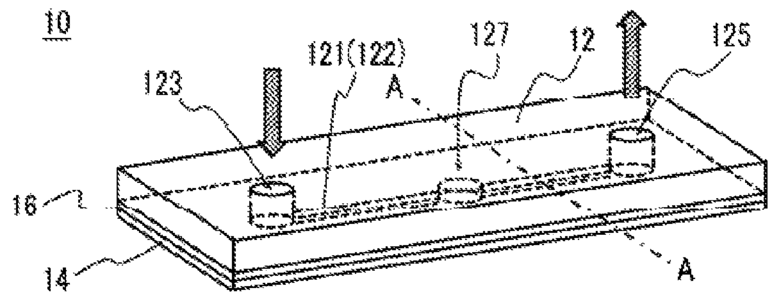
FIG. 1 is a perspective view illustrating an example of the structure of a micro flow channel chip according to an embodiment.

Hereinafter, embodiments of the invention will be explained using the attached drawings. In all of the diagrams, the same reference numeral will be assigned to similar constituent elements, and further explanation will not be repeated as appropriate.

FIG. 1 is a perspective view illustrating a structural example of a micro flow channel chip 10 according to the present embodiment. The micro flow channel chip 10 of the present embodiment is used for a treatment or an analysis of a liquid sample. The micro flow channel chip 10 includes a base material 12 having a groove 121 formed on one surface; a resin film 14; and an adhesive resin layer 16. The adhesive resin layer 16 covers the groove 121 of the base material 12, and bonds the resin film 14 to the surface of the base material 12. The glass transition temperature of the adhesive resin layer 16 is 25° C. or lower. The details will be described below.

The micro flow channel chip 10 is used for a treatment or an analysis of a liquid sample. Here, the liquid sample is not particularly limited as long as it is a liquid, and examples thereof include sweat, blood, a percolate, interstitial fluid, urine, a tissue extract, and a liquid reagent. Furthermore, examples of the treatment for a liquid sample include detection and quantification of a particular substance in a liquid sample, and separation, mixing and the like of liquid samples.

Specifically, the micro flow channel chip 10 is, for example, a micro flow channel chip on which structures such as a fine flow channel, a reactive layer, an electrophoretic column, and a membrane separation mechanism are formed. More specifically, examples of the micro flow channel chip 10 include microreaction devices (microreactors) that are widely utilized in chemistry, biochemistry, and the like; microanalysis devices such as an integrated DNA analysis device, a micro-electrophoresis device, and a micro-chromatography device; microdevices for analytic sample regulation for mass spectroscopy, liquid chromatography, or the like; and devices for physicochemical treatments such as extraction, membrane separation, and dialysis.

Advantages of using such a chip include: (1) the amount of use and the amount of exhaust of the sample or reagent used for a chemical reaction or an antigen-antibody reaction can be reduced; (2) the electric power required for the process can be reduced; (3) as the ratio of the surface area to the volume is increased, an increase in the speed of thermal transfer and mass transfer can be realized, and as a result, precise control of the reaction or separation, speed and efficiency enhancement, and suppression of side reactions can be achieved; (4) many samples can be simultaneously handled on the same substrate; (5) processes including from sampling to detection can be conducted on the same substrate; and (6) an inexpensive system that is space-saving and portable can be realized. In order to further promote these advantages, it is requested to form a finer structure. On the other hand, since the flow or movement of a fluid strongly depends on the flow channel structure, it is becoming more important to form a desired fine structure with higher accuracy.

The micro flow channel chip 10 according to the present embodiment can be produced with high shape accuracy and high efficiency, by including an adhesive resin layer 16 having a glass transition temperature of 25° C. or lower. Specifically, since the resin film 14 and the base material 12 can be bonded under mild conditions without requiring heat pressing at high temperatures, deformation and the like can be suppressed, and also, the production efficiency can be enhanced. Furthermore, the components of the adhesive resin layer 16 may be altered, or surface modification and the like of the adhesive resin layer 16 is enabled, independently of the base material 12 or the resin film 14. Therefore, it is easy to control wettability or electrostatic properties of the flow channel 122 according to the purpose. For example, control of the electroosmotic flow (EOF) and the like is made possible by alteration of the components of the adhesive resin layer 16.

The micro flow channel chip 10 illustrated in the example of this drawing includes an inlet port 123, an outlet port 125, and a detection unit 127. A liquid sample as a test object is introduced through the inlet port 123, and flows through the flow channel 122 toward the outlet port 125. For example, in the detection unit 127 provided in the middle, a substance that reacts with a detection object substance (for example, a particular protein) and emits fluorescence is immobilized, and whether the detection object substance is included in the liquid can be determined by observing the detection unit 127 using a fluorescent microscope or an optical detector. In this case, it is preferable that the micro flow channel chip 10 has low auto-fluorescence. The micro flow channel chip 10 is not limited to the configuration shown in the present drawing, and various configurations can be adopted according to the purpose. Furthermore, the micro flow channel chip 10 may be further provided with a power mechanism or a control mechanism. The detection method used by the detection unit 127 is not limited to a method based on an optical principle, and may be a method based on a mechanical, electrical or chemical principle.

The groove 121 is provided on at least one principal surface of the base material 12, or may be provided on both principal surfaces of the base material 12. According to the example of the present drawing, the flow channel 122 and the detection unit 127 are formed on one surface of the base material 12 as concavities having a bottom surface, and the inlet port 123 and the outlet port 125 are formed as through-holes in the base material 12.

The groove 121 is covered by the adhesive resin layer 16. On the surface of the adhesive resin layer 16 on the opposite side of the base material 12, a resin film 14 is further laminated. The groove 121 is a groove for a flow channel, and a tubular structure formed as the opening of the groove 121 is covered by the adhesive resin layer 16 is referred to as a flow channel 122. The adhesive resin layer 16 may cover the entire opening of the groove 121, or only a portion of the opening of the groove 121 may be covered. In that case, a portion of the groove 121 may penetrate through openings provided in the adhesive resin layer 16 and the resin film 14 (not shown in the diagram), and thus a hole that is connected to the outside of the micro flow channel chip 10 through the resin film 14 side, may be formed in the chip.

The micro flow channel chip 10 includes a flow channel 122 formed by a groove 121 having a width of, for example, from 1 μm to 2 mm, preferably from 5 μm to 800 μm, and more preferably from 5 μm to 500 μm. The micro flow channel chip 10 includes a flow channel 122 formed by a groove 121 having a depth of, for example, from 1 μm to 1 mm, preferably from 5 μm to 800 μm, and more preferably from 5 μm to 500 μm. The length of the flow channel 122 is, for example, 1 mm or more. When the width or depth is larger than or equal to the lower limit, the micro flow channel chip 10 can be produced industrially with high efficiency. Since the micro flow channel chip 10 according to the present embodiment includes an adhesive resin layer 16 having a glass transition temperature of 25° C. or lower, even if the flow channel 122 is fine, a structure with high lamination accuracy can be realized. On the other hand, when the width or depth is smaller than or equal to the upper limit, remaining of air bubbles is suppressed, and it becomes easier to control the fluid that passes through the flow channel 122.

The thickness of the resin film 14 is preferably 50 μm or more, and more preferably 60 μm or more. Furthermore, the thickness of the resin film 14 is preferably 300 μm or less, and more preferably 200 μm or less. When the thickness is smaller than or equal to the upper limit and larger than or equal to the lower limit, satisfactory workability is obtained, and the resin film can be joined with the base material 12 with high accuracy. According to the present embodiment, since the adhesive resin layer 16 is used, it is not necessary to perform heat pressing at high temperature. Therefore, the resin film 14 can be made thin, and thus, for example, temperature control within the flow channel 122 is enabled by means of the resin film 14, or reduction of the background noise caused by auto-fluorescence is enabled.

The thickness of the adhesive resin layer 16 is preferably 1 μm or more, and more preferably 3 μm or more. Furthermore, the thickness of the adhesive resin layer 16 is preferably 20 μm or less, and more preferably 15 μm or less. When the thickness is larger than or equal to the lower limit, the base material 12 and the resin film 14 can be bonded with sufficient adhesive strength. Furthermore, when the thickness is smaller than or equal to the upper limit, the flow channel shape can be retained.

In the micro flow channel chip 10, the adhesive resin layer 16 may have pressure-sensitive adhesive properties. When the adhesive resin layer 16 has pressure-sensitive adhesive properties, enhancement of the bonding strength between the base material 12 and the resin film 14 can be promoted. Furthermore, in the micro flow channel chip 10, the adhesive resin layer 16 may be cured and may not have pressure-sensitive adhesive properties.

Meanwhile, the term "pressure-sensitive adhesive properties" according to the present specification is a sort of joining. Furthermore, pressure sensitive adhesion means joining only by applying pressure for a short time at normal temperature, without using water, a solvent, heat, or the like.

The glass transition temperature of the adhesive resin layer 16 is 25° C. or lower, preferably 10° C. or lower, more preferably 0° C. or lower, even more preferably −10° C. or lower, still more preferably −20° C. or lower, and most preferably −30° C. or lower. Furthermore, the lower limit of the glass transition temperature of the adhesive resin layer 16 is not particularly limited; however, the glass transition temperature is, for example, −100° C. or higher, preferably −80° C. or higher, more preferably −60° C. or higher, and even more preferably −40° C. or higher. When the glass transition temperature of the adhesive resin layer 16 is lower than or equal to the upper limit, a layer having high flexibility and having pressure-sensitive adhesive properties is obtained. Therefore, the base material 12 and the resin film 14 can be bonded with high accuracy without being subjected to heat pressing at high temperature. The adjustment of the glass transition temperature of the adhesive resin layer 16 can be carried out by adjusting the blend of the resin composition for forming an adhesive resin layer that will be described later.

The glass transition temperature of the adhesive resin layer 16 can be measured as follows, for example, based on JIS K7121:1987, in a solvent-free state. Measurement is made using a differential scanning calorimeter (manufactured by Seiko Instruments, Inc., DSC6100) under the conditions of a rate of temperature increase of 5° C./min over a temperature range of from −100° C. to 200° C., and the glass transition temperature Tg is obtained from changes in the heating value. However, when the solvent is removed by drying, a state in which the solvent has been completely eliminated is preferable; however, in view of the working process, an unavoidable amount of residual solvent is acceptable.

The standard deviation of the distance from the bottom of the groove 121 of the micro flow channel chip 10 to the adhesive resin layer 16 is not particularly limited; however, for example, the standard deviation is 0.5 μm or less, and more preferably 0.4 μm or less. The standard deviation can be measured, for example, as follows. First, twelve measurement points in the flow channel 122 of the micro flow channel chip 10 are arbitrary determined, and the distance from the bottom of the groove 121 to the adhesive resin layer 16 is measured at each measurement point using a laser displacement meter. Here, the various measurement points are determined to be positioned in discontinuous, different flow channels or to be positioned along a flow channel at an interval of 1 mm or more from each other. Furthermore, an area set to have a large depth is not selected for the measurement point, for the purpose of detection, treatment, or the like of a liquid sample.

The design of the flow channel of the micro flow channel chip 10 is appropriately achieved in consideration of the detection object and convenience. The micro flow channel chip 10 may include a membrane, a valve, a sensor, a motor, a mixer, gears, a clutch, a microlens, an electric circuit and the like, or a plurality of lines of microchannels may be installed on the same substrate for the purpose of complexation.

In addition, a biologically active substance may be immobilized in at least a portion of the flow channel of the micro flow channel chip 10. Examples of the biologically active substance include a nucleic acid, a protein, a sugar chain, and a glycoprotein. An optimal biologically active substance is selected as appropriate, according to the characteristics of the detection object. Furthermore, a plurality of biologically active substances may be immobilized on the same channel, or different microchannels may be produced on the same micro flow channel device, and different biologically active substances may be immobilized on the respective microchannels. In order to immobilize a biologically active substance on the surface of a microchannel of the micro flow channel device, the plastic surface may be subjected to surface modification, for example, introduction of a functional group, immobilization of a functional material, impartation of hydrophilicity, and impartation of hydrophobicity.

Figure 2A:
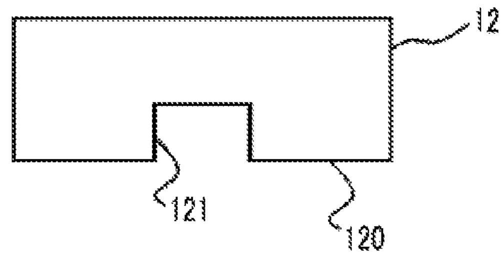
FIG. 2A, FIG. 2B and FIG. 2C are views for explaining a method for producing a micro flow channel chip according to the embodiment.
Figure 2B:
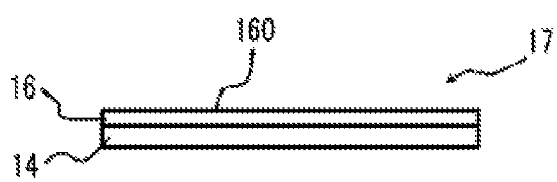
Figure 2C:
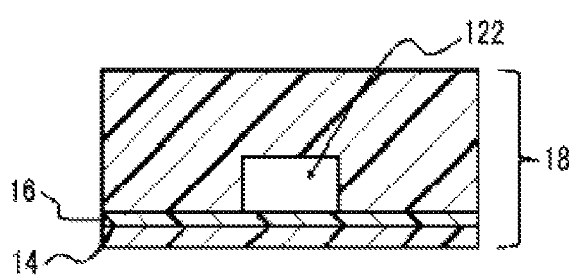

FIG. 2A, FIG. 2B and FIG. 2C illustrate a diagram for explaining a method for producing the micro flow channel chip 10 according to the present embodiment. The method for producing the micro flow channel chip (micro flow channel chip) 10 according to the present embodiment is a method for producing a micro flow channel chip 10 used for a treatment or analysis of a liquid sample. This production method includes a step of forming a groove 121 on one surface 120 of a base material 12; a lamination step and an adhesion step. In the lamination step, an adhesive resin layer 16 is formed on at least one surface of a resin film 14, and thereby a laminate (first laminate) 17 is obtained. In the adhesion step, the surface 120 of the base material 12 and the exposed surface 160 of the adhesive resin layer 16 of the laminate 17 are arranged to face each other, the laminate 17 and the base material 12 are bonded such that the adhesive resin layer 16 covers the groove 121. The glass transition temperature of the adhesive resin layer 16 is 25° C. or lower. The details will be explained below.

[Resin Film]

The resin film is not particularly limited; however, the resin film can be produced using, for example, a resin composition for forming a resin film.

The resin that is included in the resin composition for forming a resin film is not particularly limited; however, the resin may be one or more kinds of resins selected from the group consisting of resin materials such as a (meth)acrylic resin, polystyrene, polyethylene, polyvinyl chloride, polypropylene, polycarbonate, polyester, polyvinyl acetate, a vinyl-acetate copolymer, a styrene-methyl methacrylate copolymer, an acrylonitrile-styrene copolymer, an acrylonitrile-butadiene-styrene copolymer, nylon, polymethylpentene, a silicone resin, an amino resin, polysulfone, polyether sulfone, polyether imide, a fluororesin, and polyimide.

Among them, from the viewpoint of enhancing formability, it is preferable that the resin composition for forming a resin film includes a (meth)acrylic resin, and it is more preferable that the resin composition includes a (meth) acrylic resin (A) that will be described below. The (meth) acrylic resin (A) contains a structural unit (A1) represented by the following Formula (1).

Formula (1)

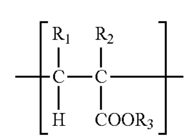

(In Formula (1), $R_1$ and $R_2$ each independently represent a hydrogen atom, a methyl group, an ethyl group, or a propyl group; and $R_3$ represents an alkyl group having from 3 to 6 carbon atoms)

Examples of the monomer that constitutes the (meth) acrylic resin (A) include acrylic acid, methacrylic acid, acrylic acid esters such as methyl acrylate, ethyl acrylate, butyl acrylate, and 2-ethylhexyl acrylate; methacrylic acid esters such as methyl methacrylate, ethyl methacrylate, and butyl methacrylate; acrylonitrile, methacrylonitrile, and acrylamide. The constituent monomer of the (meth)acrylic resin (A) includes one kind or two or more kinds of monomers among these examples. Furthermore, the constituent monomer of the (meth)acrylic resin (A) may further include monomers other than these examples.

The (meth)acrylic resin (A) is obtained by adding a polymerization initiator to a mixture of monomers, and then performing polymerization. Examples of the polymerization initiator include organic peroxide-based polymerization initiators such as benzoyl peroxide, lauroyl peroxide, t-butyl peroxyisobutyrate, t-butyl peroxy-2-ethylhexanoate, t-butyl peroxyneodecanoate, t-hexyl peroxypivalate, diisopropyl peroxydicarbonate, and bis(4-t-butylcyclohexyl) peroxydicarbonate; and azo-based polymerization initiators such as 2,2'-azobisisobutyronitrile, 2,2'-azobis(2,4-dimethylvaleronitrile), and 2,2'-azobis(4-methoxy-2,4-dimethylvaleronitrile).

The (meth)acrylic resin (A) can be produced into a resin containing at least one structural unit selected from a structural unit derived from an acrylic acid alkyl ester having an alkyl group having from 3 to 6 carbon atoms, and a structural unit derived from a methacrylic acid alkyl ester having an alkyl group having from 3 to 6 carbon atoms.

From the viewpoint of enhancing formability of the resin film 14, it is preferable that the (meth)acrylic resin (A) contains a structure in which $R_3$ in Formula (1) is an alkyl group having 4 carbon atoms, as a structural unit (A1). That is, it is preferable that the (meth)acrylic resin (A) contains at least one structural unit selected from a structural unit derived from butyl acrylate and a structural unit derived from butyl methacrylate.

Whether the resin film 14 contains the (meth)acrylic resin (A), or whether the (meth)acrylic resin (A) contains a structure in which $R_3$ in Formula (1) is an alkyl group having 4 carbon atoms, as a structural unit (A1), can be determined by, for example, a mass analysis based on GC-MS (Gas Chromatography Mass Spectrometry).

In regard to the (meth)acrylic resin (A), the percentage content of the structural unit (A1) is preferably 0.5% or more. This percentage content is preferably 15% or less, more preferably 9% or less, and even more preferably 4% or less. When the percentage content is more than or equal to the lower limit and less than or equal to the upper limit, formability can be further enhanced.

Here, the percentage content of a structural unit is the ratio of the mass of the structural unit with respect to the total mass of the resin. The percentage content can be measured by, for example, a mass analysis based on GC-MS.

Furthermore, it is preferable that the (meth)acrylic resin (A) further contains a structural unit (A2) represented by Formula (2). That is, it is preferable that the (meth)acrylic resin (A) further contains at least one structural unit selected from a structural unit derived from methyl acrylate and a structural unit derived from methyl methacrylate.

Formula (2)

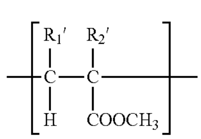

(In Formula (2), $R_1'$ and $R_2'$ each independently represent a hydrogen atom, a methyl group, an ethyl group, or a propyl group)

Whether the (meth)acrylic resin (A) contains the structural unit (A2) can be determined by, for example, a mass analysis based on GC-MS.

The resin composition for forming a resin film may include two or more (meth)acrylic resins (A) having different structures, or may further include a (meth)acrylic resin that does not contain the structural unit (A1).

The resin composition for forming a resin film may further include additives such as a pigment, a dye, an oxidation inhibitor, and a flame retardant.

The resin composition for forming a resin film is obtained by mixing the resin with other substances to be incorporated, as necessary.

Regarding the resin film 14, a commercially available film made of a resin can also be used.

[Base Material]

The base material 12 can be produced using, for example, a resin composition for forming a base material. The resin that is included in the resin composition for forming a base material is not particularly limited; however, the resin may be one or more kinds of resins selected from the group consisting of, for example, resin materials such as a (meth)acrylic resin, a styrene-based resin, a polycarbonate-based resin, a polyolefin-based resin, polystyrene, polyethylene, polyvinyl chloride, polypropylene, polyester, polyvinyl acetate, a vinyl-acetate copolymer, a styrene-methyl methacrylate copolymer, an acrylonitrile-styrene copolymer, an acrylonitrile-butadiene-styrene copolymer, nylon, polymethylpentene, a silicon resin, an amino resin, polysulfone, polyether sulfone, polyether imide, a fluororesin, and polyimide. From the viewpoints of shape accuracy and moldability enhancement, above all, it is preferable that the resin composition for forming a base material includes one or more kinds resins selected from the group consisting of a (meth)acrylic resin, a styrene-based resin, a polycarbonate-based resin, and a polyolefin-based resin.

Regarding the (meth)acrylic resin that is included in the resin composition for forming a base material, a (meth)acrylic resin (B) that will be explained below may be used. The (meth)acrylic resin (B) is a resin containing a structural unit (B1) represented by Formula (3).

Formula (3)

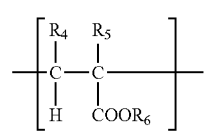

(In Formula (3), $R_4$ and $R_5$ each independently represent a hydrogen atom, a methyl group, an ethyl group, or a propyl group; and $R_6$ represents an alkyl group having from 1 to 3 carbon atoms)

Whether the base material 12 contains a (meth)acrylic resin (B) containing a structural unit (B1) can be determined by, for example, a mass analysis based on GC-MS.

Examples of the monomer that constitutes the (meth)acrylic resin (B) include acrylic acid, methacrylic acid; acrylic acid esters such as methyl acrylate, ethyl acrylate, butyl acrylate, and 2-ethylhexyl acrylate; methacrylic acid esters such as methyl methacrylate, ethyl methacrylate, and butyl methacrylate; acrylonitrile, methacrylonitrile, and acrylamide. The constituent monomers of the (meth)acrylic resin (B) includes one kind or two or more kinds of monomers among these examples. Furthermore, the constituent monomers of the (meth)acrylic resin (B) may further include a monomer other than these examples.

The (meth)acrylic resin (B) is obtained by adding a polymerization initiator to a mixture of monomers, and then performing polymerization. Examples of the polymerization initiator include organic peroxide-based polymerization initiators such as benzoyl peroxide, lauroyl peroxide, t-butyl peroxyisobutyrate, t-butyl peroxy-2-ethylhexanoate, t-butyl peroxyneodecanoate, t-hexyl peroxypivalate, diisopropyl peroxydicarbonate, and bis(4-t-butylcyclohexyl) peroxydicarbonate; and azo-based polymerization initiators such as 2,2'-azobisisobutyronitrile, 2,2'-azobis(2,4-dimethylvaleronitrile), and 2,2'-azobis(4-methoxy-2,4-dimethylvaleronitrile).

The (meth)acrylic resin (B) can be produced into a resin containing at least one structural unit selected from a structural unit derived from an acrylic acid alkyl ester having an alkyl group having from 1 to 3 carbon atoms, and a structural unit derived from a methacrylic acid alkyl ester having an alkyl group having from 1 to 3 carbon atoms.

From the viewpoint of enhancing moldability, it is preferable that the (meth)acrylic resin (B) contains a structure in which $R_6$ in Formula (3) is an alkyl group having one carbon atom, as the structural unit (B1). That is, it is preferable that the (meth)acrylic resin (B) contains at least one structural unit selected from a structural unit derived from methyl acrylate and a structural unit derived from methyl methacrylate.

Whether the (meth)acrylic resin (B) contains a structure in which $R_6$ is an alkyl group having one carbon atom as the structural unit (B1), can be determined by, for example, a mass analysis based on GC-MS.

The resin composition for forming a base material may include two or more (meth)acrylic resins (B) having different components, or may further include a (meth)acrylic resin that does not contain the structural unit (B1).

Examples of the styrene-based resin that is included in the resin composition for forming a base material include atactic polystyrene, isotactic polystyrene, high impact-resistant polystyrene (HIPS), an acrylonitrile-butadiene-styrene copolymer (ABS), an acrylonitrile-styrene copolymer (AS), a styrene-methacrylic acid copolymer, a styrene-methacrylic acid alkyl ester copolymer, a styrene-methacrylic acid glycidyl ester copolymer, a styrene-acrylic acid copolymer, a styrene-acrylic acid alkyl ester copolymer, a styrene-maleic acid copolymer, and a styrene-fumaric acid copolymer.

Examples of the polycarbonate-based resin that is included in the resin composition for forming a base material include polypropylene carbonate, polyethylene carbonate, 1,2-polybutylene carbonate, 1,3-polybutylene carbonate, 1,4-polybutylene carbonate, cis-2,3-polybutylene carbonate, trans-2,3-polybutylene carbonate, $\alpha,\beta$-polyisobutylene carbonate, $\alpha,\gamma$-polyisobutylene carbonate, cis-1,2-polycyclobutylene carbonate, trans-1,2-polycyclobutylene carbonate, cis-1,3-polycyclobutylene carbonate, trans-1,3-polycyclobutylene carbonate, polyhexene carbonate, polycyclopropene carbonate, polycyclohexene carbonate, poly(methylcyclohexene carbonate), poly(vinylcyclohexene carbonate), polydihydronaphthalene carbonate, polyhexahydrostyrene carbonate, polycyclohexane propylene carbonate, polystyrene carbonate, poly(3-phenylpropylene carbonate), poly(3-trimethylsilyloxypropylene carbonate), poly(3-methacryloyloxypropylene carbonate), polyperfluoropropylene carbonate, polynorbornene carbonate, and poly(1,3-cyclohexylene carbonate).

Examples of the polyolefin-based resin that is included in the resin composition for forming a base material include a linear high-density polyethylene, a linear low-density polyethylene, a high-pressure low-density polyethylene, isotactic polypropylene, syndiotactic polypropylene, block polypropylene, random polypropylene, polybutene, 1,2-polybutadiene, 4-methylpentene, cyclic polyolefin (cycloolefin-based resin), and copolymers of these (for example, an ethylene-methyl methacrylate copolymer).

The resin composition for forming a base material may further include additives such as a pigment, a dye, an oxidation inhibitor, and a flame retardant.

The resin composition for forming a base material is obtained by mixing the resin with other substances to be incorporated, as necessary.

The base material 12 may be formed using a commercially available plate-shaped resin material. Also, the base material 12 can be produced from a material such as glass or silicon, in addition to a resin.

[Adhesive Resin Layer]

The adhesive resin layer 16 can be produced using, for example, a resin composition for forming an adhesive resin layer. The resin that is included in the resin composition for forming an adhesive resin layer is not particularly limited, and examples include a (meth)acrylic resin, a silicone-based resin, a polyester-based resin, a polyvinyl acetate-based resin, a polyvinyl ether-based resin, and a urethane-based resin (pressure-sensitive adhesive). From the viewpoint of having excellent heat resistance and being relatively easily available at low cost, it is preferable that the resin composition for forming an adhesive resin layer includes, among others, a (meth)acrylic resin.

The (meth)acrylic resin that is included in the resin composition for forming an adhesive resin layer is not particularly limited, and examples include the (meth)acrylic resin (A) and the (meth)acrylic resin (B) described above.

The resin composition for forming an adhesive resin layer may further include additives such as a solvent, a pigment, a dye, an oxidation inhibitor, a flame retardant, and a crosslinking agent.

Regarding the solvent, from the viewpoint of solubility of the resin, dryability, and ease of handling, for example, an ester-based solvent such as ethyl acetate; an aromatic solvent such as toluene; xylene; a ketone-based solvent such as acetone or methyl ethyl ketone; an alcohol-based solvent such as methanol, ethanol, or isopropyl alcohol; and an aliphatic solvent such as hexane, may be used.

The resin composition for forming an adhesive resin layer is obtained by mixing the resin with other substances to be incorporated, as necessary. The resin composition for forming an adhesive resin layer can be produced into a liquid form.

The adhesive resin layer may be formed using a commercially available pressure-sensitive adhesive.

The various steps will be described in detail below using FIG. 2A, FIG. 2B and FIG. 2C. First, in the step of forming a groove 121 on the base material 12, as illustrated in FIG. 2A, the groove 121 is formed on one surface 120 of the base material 12. The method of forming the groove 121 on the base material 12 is not particularly limited. For example, a groove 121 is formed on a flat surface of a plate-shaped parent material formed from a resin composition for forming a base material, or a commercially available plate-shaped resin material, by cutting, photolithography, laser ablation, a hot embossing method, or the like, and thereby the base material 12 can be produced. Alternatively, a base material 12 having a groove 121 formed thereon can be produced by a method such as injection molding using a resin composition for forming a base material as the material and using a predetermined mold. Here, a concavity that forms the detection unit 127, and through-holes that form the inlet port 123 and the outlet port 125 are concurrently formed in the same manner.

Furthermore, after the step of forming a groove on the base material 12, the base material 12 may be subjected to a surface treatment before the adhesion step. In this case, the surface treatment is applied to the surface of the base material 12 on which the groove 121 has been formed. Examples of the surface treatment include a plasma treatment, a corona discharge treatment, and a surface coating treatment using a hydrophilic polymer. Examples of the hydrophilic polymer include polymers containing polyethylene glycol (PEG), EVAL™ (EVOH), POVAL™ (PVOH), and a polymer having a phosphorylcholine group, as components. By applying these surface treatments, the inner wall of the flow channel 122 is hydrophilized, and the flow can be improved.

Next, in the lamination step, the adhesive resin layer 16 is formed on at least one surface of the resin film 14, and thereby, a laminate 17 is obtained. Specifically, for example, the lamination step can be carried out as follows. First, the resin composition for forming a resin film described above is formed into a film form, and thus a resin film 14 is obtained. Then, a liquid resin composition for forming an adhesive resin layer is applied including a solvent on one of the principal surfaces of the resin film 14 by a method such as roll coating or gravure coating. Next, the resin composition for forming an adhesive resin layer is dried by drying with hot air. The drying conditions can be set to, for example, 50° C. to 150° C. and 0.5 minutes to 10 minutes. In order to cause a crosslinking agent or the like to react, the resin composition for forming an adhesive resin layer may be subjected to aging by leaving the resin composition to stand for, for example, one week after drying. In this manner, a laminate 17 in which the resin film 14 and the adhesive resin layer 16 are laminated as illustrated in FIG. 2B is obtained.

Furthermore, the laminate 17 may be subjected to a surface treatment after the lamination step and before the adhesion step. In this case, the surface treatment is applied to the exposed surface of the adhesive resin layer 16 in the laminate 17. Examples of the surface treatment include a plasma treatment, a corona discharge treatment, and a surface coating treatment using a hydrophilic polymer. Examples of the hydrophilic polymer include polymers including polyethylene glycol (PEG), EVAL™ (EVOH), POVAL™ (PVOH), and a polymer having a phosphorylcholine group, as components. By applying these surface treatments, the inner wall of the flow channel 122 is hydrophilized, and the flow can be improved.

In the adhesion step, the surface 120 of the base material 12 and the exposed surface 160 of the adhesive resin layer 16 of the laminate 17 are arranged to face each other, and the base material 12 and the laminate 17 are bonded such that the adhesive resin layer 16 covers the groove 121. Specifically, the adhesion step can be carried out as follows.

First, the surface 120 of the base material 12 and the exposed surface 160 of the adhesive resin layer 16 of the laminate 17 are arranged to face each other and laminated. At this time, lamination is achieved such that the adhesive resin layer 16 covers the groove 121 of the base material 12. In this manner, a laminate (second laminate) 18 including the base material 12 and the laminate 17, as illustrated in FIG. 2C, is obtained.

In the adhesion step, next, the laminate 18 is subjected to bonding by applying pressure, and thereby the micro flow channel chip 10 is obtained. The temperature at the time of applying pressure is preferably, for example, 15° C. or higher, and more preferably 20° C. or higher. Meanwhile, the temperature at the time of applying pressure is preferably 40° C. or lower, and more preferably 30° C. or lower. By applying pressure at a temperature lower than or equal to the upper limit and higher than or equal to the lower limit, suppression of deformation and enhancement of the production efficiency can be promoted. Pressure application can be implemented using heating means such as a heater. FIG. 2C is a cross-sectional view of the micro flow channel chip cut along the line A-A shown in FIG. 1.

The pressure employed at the time of applying pressure to the laminate 18 is, for example, preferably 0.3 MPa or higher, and more preferably 0.5 MPa or higher. Meanwhile, the pressure employed at the time of applying pressure is preferably 3.0 MPa or lower, and more preferably 2.0 MPa or lower. By applying a pressure lower than or equal to the upper limit and higher than or equal to the lower limit, suppression of deformation of the flow channel shape and enhancement of the production efficiency can be promoted.

Next, the action and effects of the present embodiment will be explained. According to the present embodiment, since a resin film and a base material can be bonded under mild conditions without requiring heat pressing at high temperature, deformation and the like can be suppressed, and the production efficiency can be increased. Therefore, a micro flow channel chip that is used for a treatment or analysis of a liquid sample can be produced with high shape accuracy and high efficiency. Also, unintended flow or movement of a fluid that is generated as a result of deformation or the like of the flow channel structure in a fine flow channel can be suppressed due to high shape accuracy.

EXAMPLES

Hereinafter, the present embodiments will be described in detail by way of Examples. These present embodiments are not intended to limit the description of these Examples by any means.

Example 1

A micro flow channel chip was produced as follows. First, an acrylic substrate having a size of 50 mm×50 mm×1.5 mm in thickness was produced using acrylic resin 1 (SUMIPEX® LG2, manufactured by Sumitomo Chemical Co., Ltd.), and a concave pattern including a flow channel groove having a width of 100 μm and a depth of 30 μm, an inlet port and an outlet port was formed thereon using a cutting machine (manufactured by Roland DG Corporation, DESKTOP ENGRAVER EGX-350). Thus, a base material 1 was obtained.

Meanwhile, as a resin film, a resin obtained by polymerizing 99.5 parts by weight of methyl methacrylate and 0.5 parts by weight of butyl acrylate was formed into a film form having a thickness of 125 μm, and thus an acrylic film 1 was obtained. Here, 2,2'-azobis(2,4-dimethylvaleronitrile) was used as a polymerization initiator. Since the yield with respect to the feed amount was almost 100%, the feed ratio of butyl acrylate may be regarded as the percentage content of the structural unit (A1) explained in the embodiments. Also, it is understood that the resin includes the above-described structural unit (A1) in which $R_3$ in Formula (1)

represents an alkyl group having 4 carbon atoms, and that the resin further includes the structural unit (A2) explained in the embodiments.

The resin composition for forming an adhesive resin layer was prepared as follows. 30 g of an acrylic resin 2 (NISSETSU PE-121, manufactured by Nippon Carbide Co., Inc.) and 30 g of ethyl acetate were mixed for one hour at normal temperature, and thus a resin composition for forming an adhesive resin layer was obtained.

The resin composition for forming an adhesive resin layer thus obtained was applied on one surface of the acrylic film 1 and was dried in an oven. Subsequently, the assembly was left to stand for one week in an environment at 24° C. In this manner, a first laminate in which an adhesive resin layer was formed on the acrylic film 1 was obtained.

Next, the base material 1 and the first laminate were laminated such that the surface of the base material 1 where a concave pattern had been formed and the adhesive resin layer of the first laminate were arranged to face each other. Thus, a second laminate was obtained. At this time, lamination was achieved such that the adhesive resin layer covered the entire concave pattern of the base material 1. The second laminate was bonded together by pressing for 3 seconds at 1.0 MPa at 25° C., and thus a micro flow channel chip 1 was obtained.

Example 2

A micro flow channel chip was obtained in the same manner as in Example 1, except that the time for pressing the second laminate was changed to 15 seconds.

Example 3

A micro flow channel chip was obtained in the same manner as in Example 1, except that the pressure applied to the second laminate was changed to 2.0 MPa.

Example 4

A micro flow channel chip was obtained in the same manner as in Example 1, except that an acrylic resin 3 (ORIBAIN™ 5160, manufactured by Toyochem Co., Ltd.) was used instead of the acrylic resin 2 as the resin for the preparation of the resin composition for forming an adhesive resin layer.

Example 5

A micro flow channel chip was obtained in the same manner as in Example 1, except that the following base material 2 was used instead of the base material 1. The base material 2 was produced in the same manner as in the case of the base material 1, except that a polycarbonate-based resin (IUPILON®-H4000, manufactured by Mitsubishi Engineering-Plastics Corporation) was used instead of the acrylic resin 1.

Example 6

A micro flow channel chip was obtained in the same manner as in Example 1, except that the following base material 3 was used instead of the base material 1. The base material 3 was produced in the same manner as in the case of the base material 1, except that a cycloolefin-based resin (ZEONOR® 1420R, manufactured by Zeon Corporation) was used instead of the acrylic resin 1.

Example 7

A micro flow channel chip was obtained in the same manner as in Example 1, except that the following base material 4 was used instead of the base material 1. The base material 4 was produced in the same manner as in case of the base material 1, except that a styrene-based resin (polystyrene, HF-77, manufactured by PS Japan Corporation) was used instead of the acrylic resin 1.

Comparative Example 1

A micro flow channel chip was obtained in the same manner as in Example 1, except that the acrylic film 1 in a state in which a resin composition for forming an adhesive resin layer was not applied thereon, was laminated on the surface of the base material 1 where a concave pattern had been formed, and the assembly was pressed for 3 seconds at 1.0 MPa at 25° C.

Comparative Example 2

A micro flow channel chip was obtained in the same manner as in Comparative Example 1, except that the time for pressing was changed to 60 seconds.

Comparative Example 3

A micro flow channel chip was obtained in the same manner as in Comparative Example 1, except that the temperature at the time of applying pressure was set to 140° C.

Comparative Example 4

A micro flow channel chip was obtained in the same manner as in Example 1, except that an acrylic resin 4 (ANISET NF-100, manufactured by Osaka Organic Chemical Industry, Ltd.) was instead of the acrylic resin 2 used as the resin for the preparation of the resin composition for forming an adhesive resin layer.

For the various Examples and Comparative Examples, the following evaluations were performed. The results are summarized in Table 1. All of the adhesive resin layers of the Examples had pressure-sensitive adhesive properties.

(Measurement of Glass Transition Temperature)

The glass transition temperature of the adhesive resin layer was measured as follows, based on JIS K7121:1987. First, the adhesive resin layer was collected from a micro flow channel chip, and a sample was produced. The sample was thoroughly dried, and the solvent was removed. The sample was subjected to measurement using a differential scanning calorimeter (manufactured by Seiko Instruments, Inc., DSC6100) under the conditions of a rate of temperature increase of 5° C./min over a temperature range of from −100° C. to 200° C., and the glass transition temperature Tg was obtained from changes in the heating value.

(Evaluation of Shape Accuracy)

For the micro flow channel chips of the various Examples and Comparative Examples, the shape accuracy was evaluated as follows. In each of the micro flow channel chip, a flow channel having a width of 100 μm and a depth of 30 μm is formed by the flow channel groove and the adhesive resin layer formed in the base material as described above. Twelve measurement points were determined along this flow channel. The measurement points were determined so as to have an interval of 1 mm or more from each other along the flow channel. At each of the measurement points, the distance from the bottom of the flow channel groove to the adhesive resin layer (hereinafter, referred to as "flow channel height") was measured using a laser displacement meter manufactured by Keyence Corporation. The standard deviation of the flow channel heights measured at the twelve points was determined. A sample in which the standard deviation was 0.3 μm or less was rated as "A"; a sample in which the standard deviation was more than 0.3 μm and 0.5 μm or less was rated as "B"; a sample in which the standard deviation was more than 0.5 μm and 1.0 μm or less was rated as "C"; and a sample in which the standard deviation was more than 1.0 μm was rated as "D".

(Evaluation of Adhesive Strength)

For the micro flow channel chips of the various Examples and Comparative Examples, the adhesive strength was evaluated. Specifically, first, when water colored with red ink was poured into the inlet port, a sample in which the water flowed only through the flow channel was rated as "B"; and a sample in which the water leaked from the flow channel through between the resin film and the base material was rated as "D". The injection pressure at the inlet port was set to be equal for the various Examples and Comparative Examples.

resin film was low, and there was a problem with the functions as micro flow channel chips. In Comparative Example 3, the flow channel height was irregular, and the shape accuracy was poor. In Examples 1 to 7, the time for pressure application was short compared to Comparative Example 2, and the temperature at the time of applying pressure was low compared to Comparative Example 3. Therefore, it is understood that Examples 1 to 7 exhibit superior production efficiency.

Thus, embodiments of the invention have been described with reference to the drawings; however, these are only examples of the invention, and various configurations other than these may also be employed.

BRIEF DESCRIPTION OF THE REFERENCE SYMBOLS

10: MICRO FLOW CHANNEL CHIP
12: BASE MATERIAL
120: SURFACE
121: GROOVE
122: FLOW CHANNEL
123: INLET PORT
125: OUTLET PORT
127: DETECTION UNIT
14: RESIN FILM
16: RESIN ADHESIVE LAYER
160: SURFACE
17: LAMINATE (FIRST LAMINATE)
18: LAMINATE (SECOND LAMINATE)

TABLE 1

| | | Example 1 | Example 2 | Example 3 | Example 4 | Example 5 | Example 6 |
|---|---|---|---|---|---|---|---|
| Material of base material | | Acrylic resin 1 | Acrylic resin 1 | Acrylic resin 1 | Acrylic resin 1 | Polycarbonate-based resin | Cycloolefin-based resin |
| Resin film | | Acrylic film 1 | Acrylic film 1 | Acrylic film 1 | Acrylic film 1 | Acrylic film 1 | Acrylic film 1 |
| Adhesive resin layer | Resin | Acrylic resin 2 | Acrylic resin 2 | Acrylic resin 2 | Acrylic resin 3 | Acrylic resin 2 | Acrylic resin 2 |
| | Glass transition temperature [° C.] | −33 | −33 | −33 | −41 | −33 | −33 |
| Conditions for pressure application | Time [sec] | 3 | 15 | 3 | 3 | 3 | 3 |
| | Temperature [° C.] | 25 | 25 | 25 | 25 | 25 | 25 |
| | Pressure [MPa] | 1.0 | 1.0 | 2.0 | 1.0 | 1.0 | 1.0 |
| Evaluation of shape accuracy | | A | A | A | B | A | A |
| Adhesive strength | | B | B | B | B | B | B |

| | | Example 7 | Comparative Example 1 | Comparative Example 2 | Comparative Example 3 | Comparative Example 4 |
|---|---|---|---|---|---|---|
| Material of base material | | Styrene-based resin | Acrylic resin 1 | Acrylic resin 1 | Acrylic resin 1 | Acrylic resin 1 |
| Resin film | | Acrylic film 1 | Acrylic film 1 | Acrylic film 1 | Acrylic film 1 | Acrylic film 1 |
| Adhesive resin layer | Resin | Acrylic resin 2 | — | — | — | Acrylic resin 4 |
| | Glass transition temperature [° C.] | −33 | — | — | — | 34 |
| Conditions for pressure application | Time [sec] | 3 | 3 | 60 | 3 | 3 |
| | Temperature [° C.] | 25 | 25 | 25 | 140 | 25 |
| | Pressure [MPa] | 1.0 | 1.0 | 1.0 | 1.0 | 1.0 |
| Evaluation of shape accuracy | | A | A | A | D | A |
| Adhesive strength | | B | D | D | B | D |

From the results described above, it is understood that the micro flow channel chips of Examples 1 to 7 each including an adhesive resin layer having a glass transition temperature of 25° C. or lower, have sufficient adhesive strength adequate for a micro flow channel chip, and also have high shape accuracy. On the other hand, in Comparative Examples 1 and 2 that did not include an adhesive resin layer, and in Comparative Example 4 having an adhesive layer having a glass transition temperature higher than 25° C., the adhesive strength between the base material and the

The invention claimed is:

1. A method for producing a micro flow channel chip, the method comprising:

a step of forming a groove on one surface of a base material;

a lamination step of forming an adhesive resin layer on at least one surface of a resin film, and thereby obtaining a first laminate; and an adhesion step of arranging the surface of the base material where a groove has been formed and the adhesive resin layer of the first laminate to face each other, and bonding the base material and the first laminate such that the adhesive resin layer covers the groove, wherein the adhesive resin layer has a glass transition temperature of 25° C. or lower.

2. The method for producing a micro flow channel chip according to claim 1, wherein the adhesive resin layer contains a (meth)acrylic resin.

3. The method for producing a micro flow channel chip according to claim 1, wherein the adhesive resin layer of the micro flow channel chip has pressure-sensitive adhesive properties.

4. The method for producing a micro flow channel chip according to claim 1, wherein the base material contains one or more kinds of resins selected from the group consisting of a (meth) acrylic resin, a styrene-based resin, a polycarbonate-based resin, and a polyolefin-based resin.

5. The method for producing a micro flow channel chip according to claim 1, wherein the groove has a standard deviation of a distance from a bottom of the micro flow channel chip to the adhesive resin layer is 0.5 μm or less.

6. The method for producing a micro flow channel chip according to claim 1, wherein the adhesion step further comprises a second laminate that includes pressing the base material and the first laminate at a temperature of from 15° C. to 40° C.

7. The method for producing a micro flow channel chip according to claim 6, wherein in the adhesion step, the second laminate is pressed at a pressure of from 0.3 MPa to 3.0 MPa.

8. A micro flow channel chip, comprising:

a base material that has a groove formed on one surface;

a resin film; and an adhesive resin layer that covers the groove of the base material and bonds the resin film to the surface of the base material, wherein the adhesive resin layer has a glass transition temperature of 25° C. or lower.

9. The micro flow channel chip according to claim 8, wherein the adhesive resin layer has pressure-sensitive adhesive properties.

10. The micro flow channel chip according to claim 8, wherein the adhesive resin layer contains a (meth)acrylic resin.

11. The micro flow channel chip according to claim 8, wherein the base material contains one or more kinds of resins selected from the group consisting of a (meth) acrylic resin, a styrene-based resin, a polycarbonate-based resin, and a polyolefin-based resin.

12. The micro flow channel chip according to claim 8, wherein the groove has a standard deviation of a distance from a bottom of the adhesive resin layer is 0.5 μm or less.

* * * * *